United States Patent
Li et al.

(10) Patent No.: US 9,299,894 B2
(45) Date of Patent: Mar. 29, 2016

(54) WAVELENGTH CONVERTING SUBSTANCE, WAVELENGTH CONVERTING GEL AND LIGHT EMITTING DEVICE

(71) Applicants: Yun-Li Li, Tainan (TW); Yu-Chu Li, Tainan (TW); Cheng-Yen Chen, Tainan (TW)

(72) Inventors: Yun-Li Li, Tainan (TW); Yu-Chu Li, Tainan (TW); Cheng-Yen Chen, Tainan (TW)

(73) Assignee: Genesis Photonics Inc., Tainan (TW)

( * ) Notice: Subject to any disclaimer, the term of this patent is extended or adjusted under 35 U.S.C. 154(b) by 151 days.

(21) Appl. No.: 13/904,030

(22) Filed: May 29, 2013

(65) Prior Publication Data

US 2014/0131751 A1     May 15, 2014

(30) Foreign Application Priority Data

Nov. 12, 2012   (TW) .............................. 101142073 A

(51) Int. Cl.
| | |
|---|---|
| *H01L 33/50* | (2010.01) |
| *G02F 1/355* | (2006.01) |
| *C09K 11/70* | (2006.01) |

(52) U.S. Cl.
CPC ............ *H01L 33/502* (2013.01); *C09K 11/706* (2013.01); *G02F 1/3556* (2013.01); *H01L 33/501* (2013.01); *H01L 33/504* (2013.01); *Y02B 20/181* (2013.01)

(58) Field of Classification Search
CPC ...................................................... G02F 1/3556
USPC ..................... 359/326–332; 257/98; 423/299; 252/519.14, 521, 1, 521.3, 521.5
See application file for complete search history.

(56) References Cited

U.S. PATENT DOCUMENTS

| | | | | |
|---|---|---|---|---|
| 7,005,679 | B2* | 2/2006 | Tarsa et al. ....................... | 257/89 |
| 7,427,784 | B2* | 9/2008 | Liu et al. ............................ | 257/99 |
| 7,679,277 | B2* | 3/2010 | Morioka et al. ............... | 313/486 |
| 7,709,852 | B2* | 5/2010 | Hohn et al. ....................... | 257/98 |
| 7,837,898 | B2* | 11/2010 | Takahara et al. ......... | 252/301.4 F |
| 7,910,940 | B2* | 3/2011 | Koike et al. ...................... | 257/98 |
| 8,076,690 | B2* | 12/2011 | Ueno et al. ....................... | 257/98 |
| 8,288,783 | B2* | 10/2012 | Kinomoto ........................ | 257/89 |
| 8,547,009 | B2* | 10/2013 | Hussell ................. | H01L 33/501 257/98 |
| 8,563,996 | B2* | 10/2013 | Ke et al. ........................... | 257/89 |
| 2007/0001188 | A1* | 1/2007 | Lee .................................. | 257/99 |
| 2009/0280592 | A1* | 11/2009 | Chen et al. ........................ | 438/35 |
| 2010/0140641 | A1 | 6/2010 | Kinomoto et al. | |
| 2011/0133654 | A1* | 6/2011 | McKenzie ................ | F21K 9/00 315/152 |

FOREIGN PATENT DOCUMENTS

| | | |
|---|---|---|
| TW | 200509411 | 3/2005 |
| TW | 201010136 | 3/2010 |
| TW | 201102694 | 1/2011 |
| TW | 201128816 | 8/2011 |
| TW | 201203621 | 1/2012 |

* cited by examiner

*Primary Examiner* — Daniel Petkovsek
(74) *Attorney, Agent, or Firm* — Jianq Chyun IP Office

(57) ABSTRACT

A wavelength converting substance is made of semiconductor material. The wavelength converting substance is suitable for absorbing an exciting light with the wavelength range falling between 300 nanometers and 490 nanometers and converting the exciting light to an emitted light with wavelength range falling between 450 nanometers and 750 nanometers.

19 Claims, 3 Drawing Sheets

WAVELENGTH CONVERTING SUBSTANCE, WAVELENGTH CONVERTING GEL AND LIGHT EMITTING DEVICE

CROSS-REFERENCE TO RELATED APPLICATION

This application claims the priority benefit of Taiwan application serial no. 101142073, filed on Nov. 12, 2012. The entirety of the above-mentioned patent application is hereby incorporated by reference herein and made a part of this specification.

BACKGROUND

1. Field of the Invention

The invention relates to a wavelength converting substance, a wavelength converting gel and a light emitting device, and more particularly, to a wavelength converting substance made of a semiconductor material and a wavelength converting gel and a light emitting device adopting the wavelength converting substance.

2. Description of Related Art

In recent years, since a luminous efficiency of a light emitting diode continues to advance, a white light emitting element of the light emitting diode has gradually trended to replace the traditional fluorescent lamp and the incandescent bulb in application fields of, for example, a light source of a scanner, a backlight source of a liquid crystal display screen, a lighting equipment or so forth. Currently, common technology of a single-chip white light emitting diode mainly uses a blue light emitting diode chip with an emission wavelength range falling between 440 nanometers and 460 nanometers to excite yellow fluorescent powders, so as to produce a white light via mixing blue light and yellow. Although the aforementioned method has advantages of simple process and low cost, a color saturation and a color rendering index (CRI) of the resulting white light (with a color temperature in range of 4000K to 6000K) are still a distance apart from that of a conventional warm white light (with a color temperature lower than 4000K).

SUMMARY OF THE INVENTION

The invention provides a wavelength converting substance made of a semiconductor material.

The invention provides a wavelength converting gel including the aforementioned wavelength converting substance and is suitable for converting an exciting light to a warm white light with lower color temperature.

The invention provides a light emitting device having a favorable color rendering index (CRI).

The invention provides a wavelength converting substance made of a semiconductor material. The wavelength converting substance is suitable for absorbing an exciting light with wavelength range falling between 300 nanometers and 490 nanometers and converting the exciting light to an emitted light with wavelength range falling between 450 nanometers and 750 nanometers.

In an embodiment of the invention, a chemical formula of the wavelength converting substance is $(Al_xGa_{1-x})_yIn_{1-y}P$, wherein $0 \leq x \leq 0.7$ and $0 \leq y \leq 0.7$.

In an embodiment of the invention, the wavelength range of the emitted light is falling between 570 nanometers and 750 nanometers.

The invention further provides a wavelength converting gel including an encapsulating glue and a plurality of wavelength converting substances. The wavelength converting substances are made of a semiconductor material and are dispersed within the encapsulating glue. Each wavelength converting substance is suitable for absorbing an exciting light with wavelength range falling between 300 nanometers and 490 nanometers and converting the exciting light to an emitted light with wavelength range falling between 450 nanometers and 750 nanometers.

In an embodiment of the invention, the wavelength converting gel further includes a plurality of yellow fluorescent materials dispersed within the encapsulating glue, wherein a wavelength range of an emitted light of each yellow fluorescent material falls between 500 nanometers and 570 nanometers.

In an embodiment of the invention, each yellow fluorescent material includes yttrium aluminum garnet fluorescent powders, terbium aluminum garnet fluorescent powders, lutetium aluminum garnet fluorescent powders, silicate fluorescent powders or nitride fluorescent powders.

In an embodiment of the invention, a particle size of each wavelength converting substance is ranged from 1 micron to 100 microns.

In an embodiment of the invention, a chemical formula of each wavelength converting substance is $(Al_xGa_{1-x})_yIn_{1-y}P$, wherein $0 \leq x \leq 0.7$ and $0 \leq y \leq 0.7$.

The invention further provides a light emitting device including a light emitting element and at least one wavelength converting substance. The light emitting element emits an exciting light with wavelength range falling between 300 nanometers and 490 nanometers. The wavelength converting substance is disposed on the light emitting element and the wavelength converting substances is made of a semiconductor material, wherein each wavelength converting substance absorbs the exciting light and converts the exciting light to an emitted light with wavelength range falling between 450 nanometers and 750 nanometers.

In an embodiment of the invention, the wavelength converting substance is in a powder form, and a particle size of the wavelength converting substance is ranged from 1 micron to 100 microns.

In an embodiment of the invention, the light emitting element includes a substrate, a first-type semiconductor layer, a second-type semiconductor layer, a light emitting layer, a first electrode and a second electrode. The first-type semiconductor layer, the light emitting layer and the second-type semiconductor layer are sequentially stacked on an upper surface of the substrate, whereas the first electrode and the second electrode are respectively disposed on the first-type semiconductor layer and the second-type semiconductor layer. The wavelength converting substance covers a lower surface of the substrate opposite to the upper surface, and the wavelength converting substance is a sheet wavelength converting substance.

In an embodiment of the invention, the light emitting device further includes a sealant, and the at least one wavelength converting substance includes a plurality of wavelength converting substances, wherein the sealant covers the light emitting element and the wavelength converting substances.

In an embodiment of the invention, the light emitting device further includes a plurality of yellow fluorescent materials dispersed within the sealant, wherein each yellow fluorescent material is excited by the exciting light to emit a fluorescence with wavelength range falling between 500 nanometers and 570 nanometers.

In an embodiment of the invention, the light emitting element is a gallium nitride (GaN) based light emitting diode chip.

In an embodiment of the invention, the light emitting device further includes an encapsulating glue, and the at least one wavelength converting substance includes a plurality of wavelength converting substances, wherein the encapsulating glue mixes with the wavelength converting substances so as to define a wavelength converting gel.

In an embodiment of the invention, the light emitting device further includes a transparent layer covering the light emitting element and disposed between the wavelength converting gel and the light emitting element.

In an embodiment of the invention, a refractive index of the transparent layer is ranged from 1.0 to 2.0, and the transparent layer is an air layer or a film layer made of inorganic material.

In an embodiment of the invention, the light emitting device further includes a yellow fluorescent adhesive layer disposed between the transparent layer and the wavelength converting gel, wherein the yellow fluorescent adhesive layer is excited by the exciting light to emit a fluorescence with wavelength range falling between 500 nanometers and 570 nanometers.

In an embodiment of the invention, a chemical formula of the wavelength converting substance is $(Al_xGa_{1-x})_yIn_{1-y}P$, wherein $0 \leq x \leq 0.7$ and $0 \leq y \leq 0.7$.

According to the foregoing, in the invention, the wavelength converting substance made of the semiconductor material absorbs the exiting light emitted from the light emitting element to generate the emitted light. Therefore, as compared to a conventional method of mixing a yellow light emitted from the yellow fluorescent powders and a blue light to generate the white light, the exciting light and the emitted light of the invention may be mixed into a warm white light with a lower color temperature which has a favorable color rendering index.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
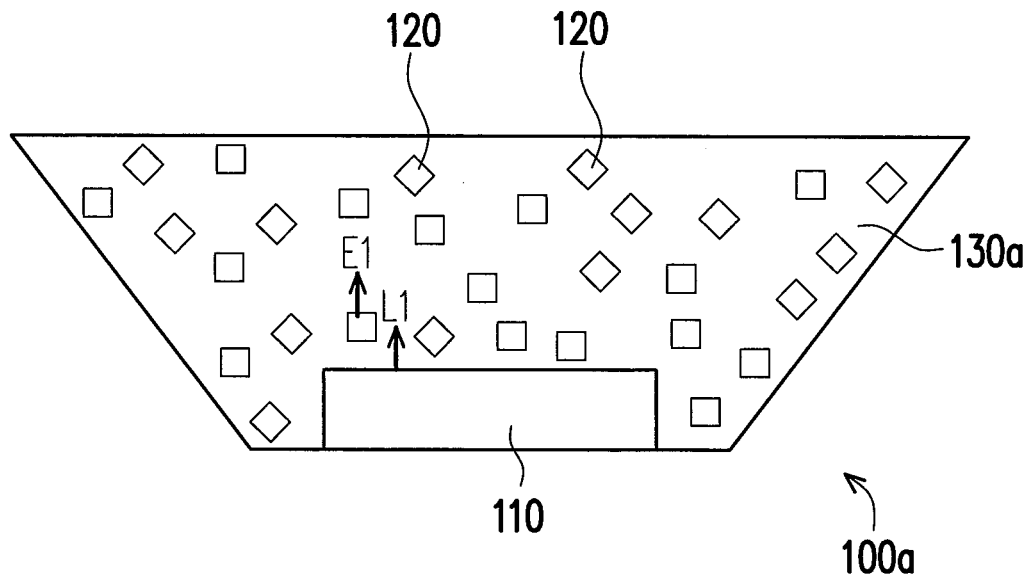
FIG. 1 is a cross sectional view schematically illustrating a light emitting device according to an embodiment of the invention.

FIG. 1 is a cross sectional view schematically illustrating a light emitting device according to an embodiment of the invention. Referring to FIG. 1, in the present embodiment, the light emitting device 100a includes a light emitting element 110 and at least one wavelength converting substance 120 (FIG. 1 depicts a plurality). The light emitting element 110 is suitable for emitting an exciting light L1 with wavelength range falling between 300 nanometers and 490 nanometers. Particularly, the wavelength converting substances 120 are disposed on the light emitting element 110 and the wavelength converting substances 120 are made of a semiconductor material, wherein each wavelength converting substance 120 is suitable for absorbing the exciting light L1 and converting the exciting light L1 to an emitted light E1 with wavelength range falling between 450 nanometers and 750 nanometers. Herein, the wavelength range represents a range of a dominant wavelength ($\lambda d$).

More specifically, the light emitting element 110 of the present embodiment is a gallium nitride (GaN) light emitting diode chip. Herein, a chemical formula of the wavelength converting substances 120 are $(Al_xGa_{1-x})_yIn_{1-y}P$, wherein $0 \leq x \leq 0.7$ and $0 \leq y \leq 0.7$. Preferably, the wavelength range of the emitted light E1 is falling between 570 nanometers and 750 nanometers. A particle size of each wavelength converting substance 120, more preferably, is ranged from 1 micron to 100 microns. In addition, the light emitting device 100a of the present embodiment may further include a sealant 130a, wherein the sealant 130a covers the light emitting element 110 and the wavelength converting substances 120. Herein, the sealant 130a is made of an inorganic material, and a refractive index of the sealant 130a is ranged from 1.3 to 2.0.

When the light emitting element 110 emits the exciting light L1 with wavelength range falling between 300 nanometers and 490 nanometers, the wavelength converting substances 120 absorb the exciting light L1 emitted from the light emitting element 110 to emit the emitted light E1 with wavelength range falling between 450 nanometers and 750 nanometers. Herein, a waveband of the emitted light E1, compared to conventional yellow fluorescent powders, is much closer to a red band. Therefore, by mixing together the emitted light E1 emitted from the wavelength converting substances 120 made of the semiconductor material with the exciting light L1, a warm white light with lower color temperature may be formed. Therefore, the light emitting device 100a of present embodiment, compared to a conventional white light emitting diode, may have a more favorable color rendering index.

The following embodiments have adopted element notations and part of the contents from the previous embodiments, wherein the same notations are used for representing the same or similar elements, and descriptions of the same technical contents are omitted. The descriptions regarding to the omitted part may be referred to the previous embodiments, and thus is not repeated herein.

Figure 2:
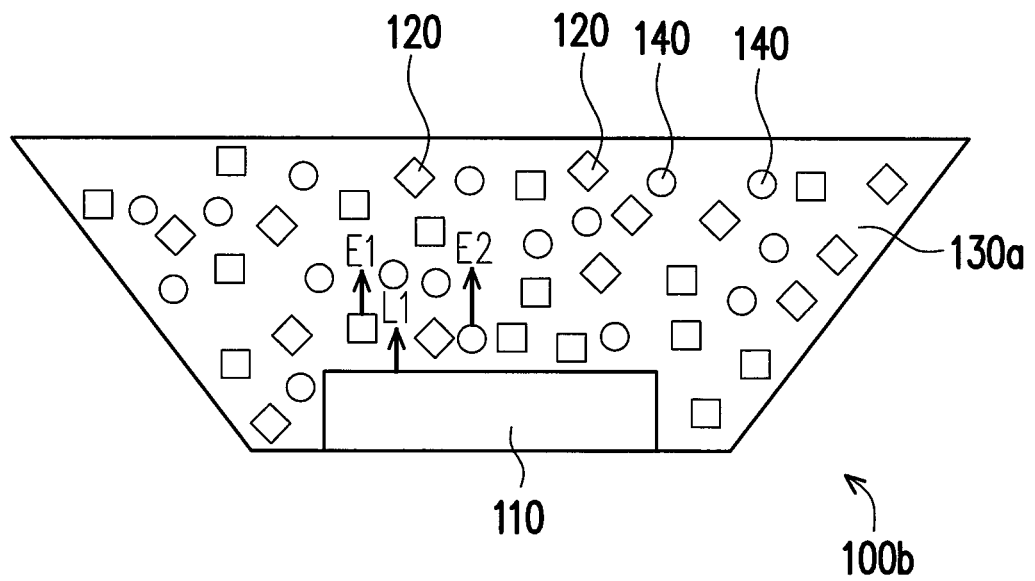
FIG. 2 is a cross sectional view schematically illustrating a light emitting device according to another embodiment of the invention.

FIG. 2 is a cross sectional view schematically illustrating a light emitting device according to another embodiment of the invention. Referring to FIG. 2, a light emitting device 100b of the present embodiment is similar to the light emitting device 100a illustrated in FIG. 1, and the main difference of the two merely lies in that: the light emitting device 100b of the present embodiment further includes a plurality of yellow fluorescent materials 140 dispersed within the sealant 130a, wherein each yellow fluorescent material 140 is excited by the exciting light L1 emitted from the light emitting element 110 to emit a fluorescence E2 with wavelength range falling between 500 nanometers and 570 nanometers. Herein, each yellow fluorescent material is, for example, yttrium aluminum garnet fluorescent powders, terbium aluminum garnet fluorescent powders, lutetium aluminum garnet fluorescent powders, silicate fluorescent powders or nitride fluorescent powders.

When the light emitting element 110 emits the exciting light L1 with wavelength range falling between 300 nanometers and 490 nanometers, the wavelength converting substances 120 absorb exciting light L1 emitted from the light emitting element 110 to emit the emitted light E1 with wavelength range falling between 450 nanometers and 750 nanometers. At the same time, the yellow fluorescent materials 140 also absorb the exciting light L1 emitted from the light emitting element 110 to emit the fluorescence E2 with wavelength range falling between 500 nanometers and 570 nanometers. Therefore, by mixing together the emitted light E1 emitted from the wavelength converting substances 120 made of the semiconductor material, the fluorescents E2 emitted from the yellow fluorescent materials 140 and the exciting light L1, the warm white light with the lower color temperature may be formed. Hence, the light emitting device 100b of the present embodiment, compared to the conventional light emitting diode of white color, has a more favorable color rendering index.

Figure 3:
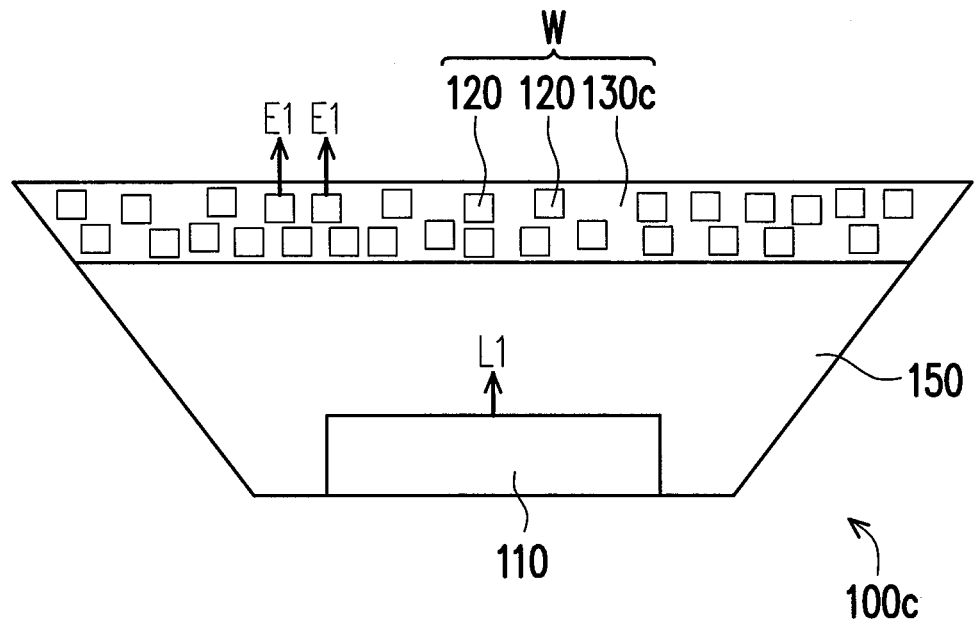
FIG. 3 is a cross sectional view schematically illustrating a light emitting device according to yet another embodiment of the invention.

FIG. 3 is a cross sectional view schematically illustrating a light emitting device according to yet another embodiment of the invention. Referring to FIG. 3, a light emitting device 100c of the present embodiment is similar to the light emitting device 100a illustrated in FIG. 1, and the main difference of the two merely lies in that, the light emitting device 100c of the present embodiment further includes an encapsulating glue 130c, wherein the encapsulating glue 130c mixes with the wavelength converting substances 120 so as to define a wavelength converting gel W. Furthermore, the light emitting device 100c of the present embodiment may further include a transparent layer 150 covering the light emitting element 110 and disposed between the wavelength converting gel W and the light emitting element 110, wherein the transparent layer 150 is, for example, an air layer or a film layer made of inorganic material, and a refractive index of the transparent layer 150 is, for example, ranged from 1.0 to 2.0. In other words, the encapsulating glue 130c of the present embodiment does not cover the light emitting element 110, and instead, the transparent layer 150 is completely covering the light emitting element 110. As a result, the wavelength converting substances 120 are away from the light emitting element 110, the wavelength converting substances 120 are not affected by a heat generated by the light emitting element 110; thereby, a conversion efficiency of the wavelength converting substances 120 is not lowered due to the heat, so that a color temperature and a color rendering index of the light emitting element 100c of the present embodiment may remain constant.

Figure 4:
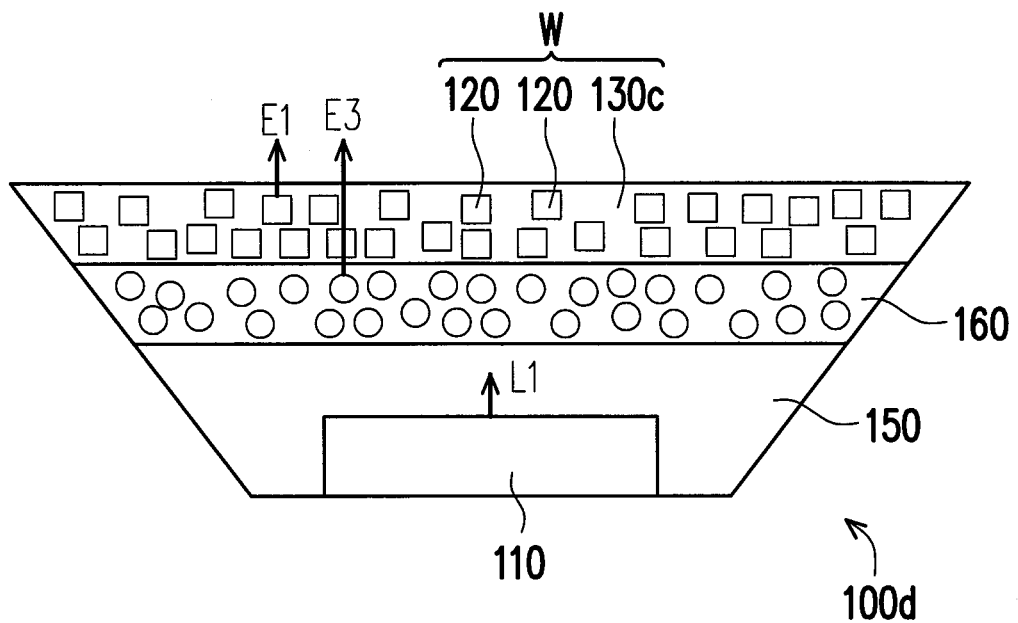
FIG. 4 is a cross sectional view schematically illustrating a light emitting device according to still another embodiment of the invention.

FIG. 4 is a cross sectional view schematically illustrating a light emitting device according to still another embodiment of the invention. Referring to FIG. 4, a light emitting device 100d of the present embodiment is similar to the light emitting device 100c depicted in FIG. 3, and the main difference of the two merely lies in that: the light emitting device 100d of the present embodiment further include a yellow fluorescent adhesive layer 160 disposed between the transparent layer 150 and the wavelength converting gel W, wherein the yellow fluorescent adhesive layer 160 absorbs the exciting light L1 to emit a fluorescence E3 with wavelength range falling between 500 nanometers and 570 nanometers.

When the light emitting element 110 emits the exciting light L1 with wavelength range falling between 300 nanometers and 490 nanometers, the yellow fluorescent adhesive layer 160 absorbs the exciting light L1 emitted from the light emitting element 110 to emit the fluorescence E3 with wavelength range falling between 500 nanometers and 570 nanometers. The wavelength converting substances 120 absorb the exciting light L1 and the fluorescence E3 that penetrated the yellow fluorescent adhesive layer 160, and emits the emitted light E1 with wavelength range falling between 450 nanometers and 750 nanometers. Therefore, by mixing together the emitted light E1 emitted from the wavelength converting substances 120 made of the semiconductor material, the fluorescence E3 emitted from the yellow fluorescent adhesive layer 160 and the exciting light L1, the warm white light of the lower color temperature may be formed. Hence, the light emitting device 100d of the present embodiment, compared to the conventional white light emitting diode, may have a more favorable color rendering index.

Figure 5:
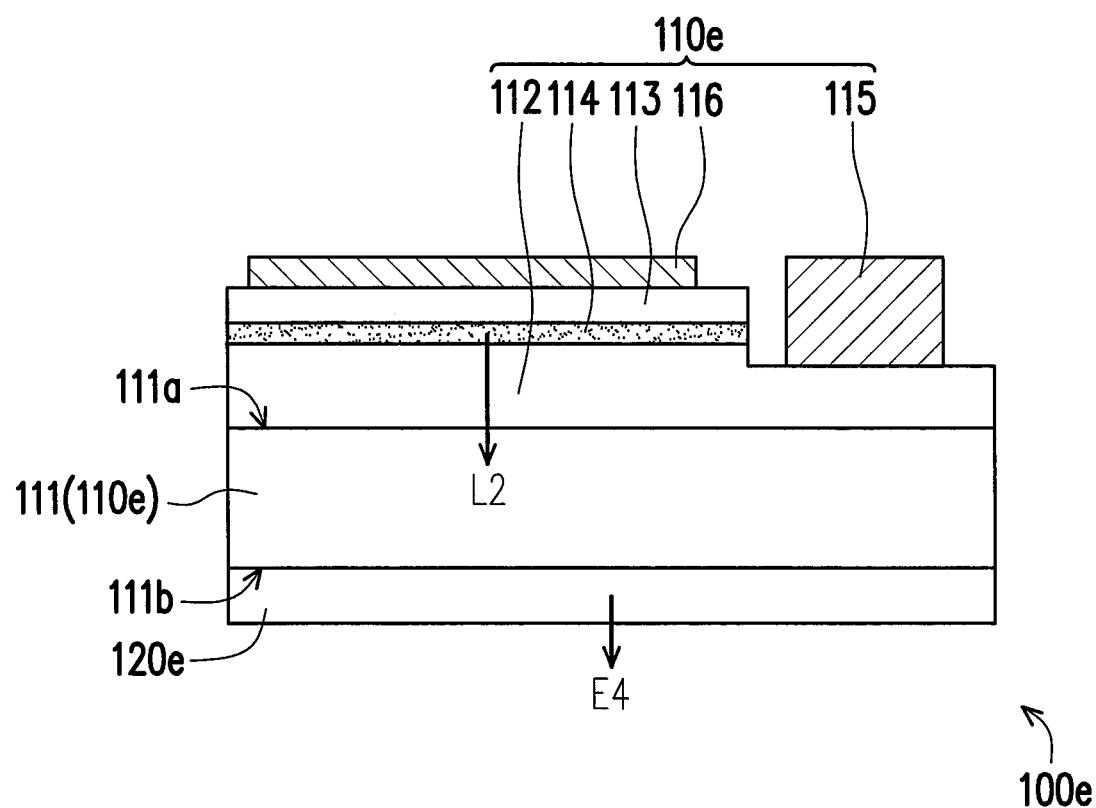
FIG. 5 is a cross sectional view schematically illustrating a light emitting device according to still yet another embodiment of the invention.

FIG. 5 is a cross sectional view schematically illustrating a light emitting device according to still yet another embodiment of the invention. Referring to FIG. 5, a light emitting element 110e of a light emitting device 100e of the present embodiment is made of a substrate 111, a first-type semiconductor layer 112, a second-type semiconductor layer 113, a light emitting layer 114, a first electrode 115 and a second electrode 116. The first-type semiconductor layer 112, the light emitting layer 114 and the second-type semiconductor layer 113 are sequentially stacked on an upper surface 111a of the substrate 111, and the first electrode 115 and the second electrode 116 are respectively disposed on the first-type semiconductor layer 112 and the second-type semiconductor layer 113. The light emitting element 110e is a flip-chip light emitting element and is suitable for emitting the exciting light L2 with the wavelength range falling between 300 nanometers and 490 nanometers. Particularly, a wavelength converting substance 120e covers a lower surface 111b of the substrate 111 opposite to the upper surface 111a, wherein the wavelength converting substance 120e is made of a semiconductor material, and the wavelength converting substance 120e is substantially a sheet wavelength converting substance.

Since the wavelength converting substance 120e of the present embodiment is suitable for absorbing the exciting light L2 and converting the exciting light L2 to an emitted light E4 with a wavelength range falling between 450 nanometers and 750 nanometers, by mixing the emitted light E4 emitted from the wavelength converting substance 120e made of the semiconductor material with the exciting light L2, the warm white light with the lower color temperature may be formed. Therefore, the light emitting device 100e of the present embodiment, compared to the conventional white light emitting diode, may have a more favorable color rendering index.

In summary, in the invention, the wavelength converting substance made of the semiconductor material absorbs the exiting light emitted from the light emitting element to generate the emitted light. Therefore, as compared to the conventional method of mixing a yellow light emitted from the yellow fluorescent powders and a blue light to generate the white light, the exciting light and the emitted light of the invention may be mixed into the warm white light with the lower color temperature which has the favorable rendering index.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A wavelength converting substance made of a semiconductor material, the wavelength converting substance being configured to absorb an exciting light with a wavelength range falling between 300 nanometers and 490 nanometers, and the exciting light being converted to an emitted light with a wavelength range falling between 450 nanometers and 750 nanometers, wherein a chemical formula of the wavelength converting substance is $(Al_xGa_{1-x})_yIn_{1-y}P$, wherein $0<x\leq0.7$ and $0<y\leq0.7$.

2. The wavelength converting substance as recited in claim 1, wherein the wavelength range of the emitted light falls between 570 nanometers and 750 nanometers.

3. A light emitting device comprising:
   a light emitting element, the light emitting element emitting an exciting light with a wavelength range falling between 300 nanometers and 490 nanometers;
   an inorganic encapsulant; and
   a plurality of wavelength converting substances made of a semiconductor material and dispersed within the inorganic encapsulant, each wavelength converting substance being configured to absorb an exciting light with a wavelength range falling between 300 nanometers and 490 nanometers, and the exciting light being converted to an emitted light with a wavelength range falling between 450 nanometers and 750 nanometers, and a chemical formula of each wavelength converting substance is $(Al_xGa_{1-x})_yIn_{1-y}P$, wherein $0<x\leq0.7$ and $0<y\leq0.7$.

4. The light emitting device as recited in claim 3 further comprising a plurality of yellow fluorescent materials dispersed within the inorganic encapsulant.

5. The light emitting device as recited in claim 4, wherein each yellow fluorescent material comprises yttrium aluminum garnet fluorescent powders, terbium aluminum garnet fluorescent powders, lutetium aluminum garnet fluorescent powders, silicate fluorescent powders or nitride fluorescent powders.

6. The light emitting device as recited in claim 3, wherein a particle size of each wavelength converting substance is ranged from 1 micron to 100 microns.

7. The light emitting device as recited in claim 3, wherein the light emitting element comprises a substrate and a light emitting layer, the light emitting layer-is formed on an upper side of the substrate, and the wavelength converting substance covers a lower surface of the substrate opposite to the upper side.

8. The light emitting device as recited in claim 3, wherein a refractive index of the inorganic encapsulant ranges from 1.3 to 2.0.

9. A light emitting device comprising:
   a light emitting element, the light emitting element emitting an exciting light with a wavelength range falling between 300 nanometers and 490 nanometers; and
   at least one wavelength converting substance disposed on the light emitting element, the wavelength converting substance made of a semiconductor material, wherein each wavelength converting substance absorbs the exciting light and converts the exciting light to an emitted light with a wavelength range falling between 450 nanometers and 750 nanometers, wherein a chemical formula of the wavelength converting substance is $(Al_xGa_{1-x})_yIn_{1-y}P$, wherein $0<x\leq0.7$ and $0<y\leq0.7$.

10. The light emitting device as recited in claim 9, wherein the wavelength converting substance is in a powder form, and a particle size of the wavelength converting substance is ranged from 1 micron to 100 microns.

11. The light emitting device as recited in claim 10 further comprising a sealant, and the at least one wavelength converting substance comprising a plurality of wavelength converting substances, wherein the sealant covers the light emitting element and the wavelength converting substances.

12. The light emitting device as recited in claim 11 further comprising a plurality of yellow fluorescent materials dispersed within the sealant.

13. The light emitting device as recited in claim 10 further comprising an encapsulating glue, and the at least one wavelength converting substance comprising a plurality of wavelength converting substances, wherein the encapsulating glue mixes with the wavelength converting substances so as to define a wavelength converting gel.

14. The light emitting device as recited in claim 13 further comprising a transparent layer covering the light emitting element and disposed between the wavelength converting gel and the light emitting element.

15. The light emitting device as recited in claim 14, wherein a refractive index of the transparent layer is ranged from 1.0 to 2.0, and the transparent layer is an air layer or a film layer made of inorganic material.

16. The light emitting device as recited in claim 14 further comprising a yellow fluorescent adhesive layer disposed between the transparent layer and the wavelength converting gel, wherein the yellow fluorescent adhesive layer is excited by the exciting light to emit a fluorescence with a wavelength range falling between 500 nanometers and 570 nanometers.

17. The light emitting device as recited in claim 11, wherein the sealant is an inorganic sealant.

18. The light emitting device as recited in claim 17, wherein a refractive index of the inorganic sealant ranges from 1.3 to 2.0.

19. The light emitting device as recited in claim 9, wherein the light emitting element comprises a substrate and a light emitting layer, the light emitting layer is formed on an upper side of the substrate, the wavelength converting substance covers a lower surface of the substrate opposite to the upper side, and the wavelength converting substance is a sheet wavelength converting substance.

* * * * *